(12) United States Patent
Shikauchi et al.

(10) Patent No.: US 10,679,984 B2
(45) Date of Patent: Jun. 9, 2020

(54) SEMICONDUCTOR DEVICE AND METHOD FOR FORMING THE SEMICONDUCTOR DEVICE

(71) Applicant: Sanken Electric Co., Ltd., Niiza-Shi, Saitama (JP)

(72) Inventors: Hiroshi Shikauchi, Niiza (JP); Satoru Washiya, Niiza (JP); Yuki Tanaka, Niiza (JP); Ning Wei, Niiza (JP)

(73) Assignee: Sanken Electric Co., Ltd., Niiza-Shi (JP)

( * ) Notice: Subject to any disclaimer, the term of this patent is extended or adjusted under 35 U.S.C. 154(b) by 0 days.

(21) Appl. No.: 16/030,925

(22) Filed: Jul. 10, 2018

(65) Prior Publication Data

US 2020/0020682 A1 Jan. 16, 2020

(51) Int. Cl.
| | |
|---|---|
| *H01L 27/06* | (2006.01) |
| *H01L 29/20* | (2006.01) |
| *H01L 21/8258* | (2006.01) |
| *H01L 21/8234* | (2006.01) |
| *H01L 29/872* | (2006.01) |

(52) U.S. Cl.
CPC ...... *H01L 27/0629* (2013.01); *H01L 21/8234* (2013.01); *H01L 21/8258* (2013.01); *H01L 29/2003* (2013.01); *H01L 29/872* (2013.01)

(58) Field of Classification Search
CPC ....... H01L 29/7802–7815; H01L 29/861–885; H01L 27/0629
See application file for complete search history.

(56) References Cited

U.S. PATENT DOCUMENTS

| | | | |
|---|---|---|---|
| 6,967,374 B1 * | 11/2005 | Saito | H01L 29/0634 257/341 |
| 2007/0108513 A1 * | 5/2007 | Rub | H01L 29/0653 257/329 |
| 2013/0037906 A1 * | 2/2013 | Hirler | H01L 21/761 257/506 |
| 2013/0069082 A1 | 3/2013 | Okada et al. | |
| 2014/0225126 A1 * | 8/2014 | Aketa | H01L 29/41766 257/77 |

\* cited by examiner

*Primary Examiner* — Stephen M Bradley
(74) *Attorney, Agent, or Firm* — Harness, Dickey & Pierce, P.L.C.

(57) ABSTRACT

A semiconductor device and a method for forming the semiconductor device. The semiconductor device includes: a unipolar component at least including an epitaxial layer; a transition layer connected to the epitaxial layer; and a bypass component connected to the transition layer; the unipolar component and the bypass component are connected in parallel and the transition layer is configured between the unipolar component and the bypass component.

17 Claims, 3 Drawing Sheets

SEMICONDUCTOR DEVICE AND METHOD FOR FORMING THE SEMICONDUCTOR DEVICE

TECHNICAL FIELD

Embodiments of the present disclosure generally relate to the field of semiconductor, and more particularly, to a semiconductor device and a method for forming the semiconductor device.

BACKGROUND

In order to provide a semiconductor device having high reliability and capable of reducing increase in on-resistance, a unipolar compound semiconductor element is configured to be connected to a bypass semiconductor element in parallel.

FIG. 1 is a diagram which shows a schematic illustration of the unipolar compound semiconductor element 101 and the bypass semiconductor element 102 in the prior art. As shown in FIG. 1, the unipolar compound semiconductor element 101 is connected to the bypass semiconductor element 102 though external lines "L".

Reference document 1: US2013/0069082A1

This section introduces aspects that may facilitate a better understanding of the disclosure. Accordingly, the statements of this section are to be read in this light and are not to be understood as admissions about what is in the prior art or what is not in the prior art.

SUMMARY

However, the inventor found that the unipolar compound semiconductor element 101 and the bypass semiconductor element 102 are separately configured and connected via external lines, such that an assembly area becomes large, furthermore, there exists a problem of heat generation.

In order to solve at least part of the above problems, methods, apparatus, devices are provided in the present disclosure. Features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a semiconductor device and a method for forming the semiconductor device. It is expected to decrease the assembly area while reduce the heat generation.

In a first aspect, a semiconductor device is provided, includes: a unipolar component at least including an epitaxial layer; a transition layer connected to the epitaxial layer; and a bypass component connected to the transition layer; the unipolar component and the bypass component are connected in parallel and the transition layer is configured between the unipolar component and the bypass component.

In one embodiment, the semiconductor device further includes: a substrate on which the epitaxial layer is configured.

In one embodiment, the bypass component is a vertical type element.

In one embodiment, the semiconductor device further includes: a first electrode configured on a first side of the unipolar component and the bypass component; and a second electrode configured on a second side of the unipolar component and the bypass component; a source of the unipolar component is connected to an anode of the bypass component via the first electrode, a drain of the unipolar component is connected to a cathode of the bypass component via the second electrode.

In one embodiment, the bypass component is a horizontal type element.

In one embodiment, the semiconductor device further includes: a first electrode configured on a first side of the unipolar component and the bypass component; a second electrode configured on a first side of the bypass component; and a third electrode configured on a second side of the unipolar component and the bypass component; a source of the unipolar component is connected to an anode of the bypass component via the first electrode, a drain of the unipolar component is connected to a cathode of the bypass component via the second electrode and the third electrode.

In one embodiment, at least one bypass component is configured around at least one lateral side of the unipolar component.

In one embodiment, the bypass component comprises silicon material; and the transition layer comprises silicon carbide material.

In one embodiment, a concentration of carbide in the transition layer on the side of the unipolar component is higher than the concentration of carbide in the transition layer on the side of the bypass component.

In one embodiment, the bypass component comprises gallium nitride (GaN) material; and the transition layer comprises indium aluminum gallium nitride (InAlGaN) material.

In one embodiment, a concentration of gallium in the transition layer on the side of the unipolar component is lower than the concentration of gallium in the transition layer on the side of the bypass component.

In one embodiment, the transition layer comprises a multi-layer structure.

In a second aspect, a method for forming a semiconductor device is provided, includes: providing a unipolar component at least comprising an epitaxial layer; providing a transition layer connected to the epitaxial layer; and providing a bypass component connected to the transition layer; the unipolar component and the bypass component are connected in parallel and the transition layer is configured between the unipolar component and the bypass component.

In one embodiment, the method further includes: providing a substrate on which the epitaxial layer is configured.

In one embodiment, the bypass component is a vertical type element; and the method further includes: providing a first electrode configured on a first side of the unipolar component and the bypass component; and providing a second electrode configured on a second side of the unipolar component and the bypass component; a source of the unipolar component is connected to an anode of the bypass component via the first electrode, a drain of the unipolar component is connected to a cathode of the bypass component via the second electrode.

In one embodiment, the bypass component is a horizontal type element; and the method further includes: providing a first electrode configured on a first side of the unipolar component and the bypass component; providing a second electrode configured on a first side of the bypass component; and providing a third electrode configured on a second side of the unipolar component and the bypass component; a source of the unipolar component is connected to an anode of the bypass component via the first electrode, a drain of the unipolar component is connected to a cathode of the bypass component via the second electrode and the third electrode.

According to various embodiments of the present disclosure, a unipolar component and a bypass component are connected in parallel and a transition layer is configured between the unipolar component and the bypass component. Therefore, the unipolar component and the bypass component are assembled via the transition layer in a semiconductor device, the assembly area can be decreased while the heat generation can be reduced.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

It should be understood that when an element is referred to as being "connected" or "coupled" or "contacted" to another element, it may be directly connected or coupled or contacted to the other element or intervening elements may be present. In contrast, when an element is referred to as being "directly connected" or "directly coupled" or "directly contacted" to another element, there are no intervening elements present. Other words used to describe the relationship between elements should be interpreted in a like fashion (e.g., "between" versus "directly between", "adjacent" versus "directly adjacent", etc.).

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof.

The term "based on" is to be read as "based at least in part on". The term "cover" is to be read as "at least in part cover".

The term "one embodiment" and "an embodiment" are to be read as "at least one embodiment". The term "another embodiment" is to be read as "at least one other embodiment". Other definitions, explicit and implicit, may be included below.

In this disclosure, unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A First Aspect of Embodiments

A semiconductor device is provided in the embodiments.

Figure 1:
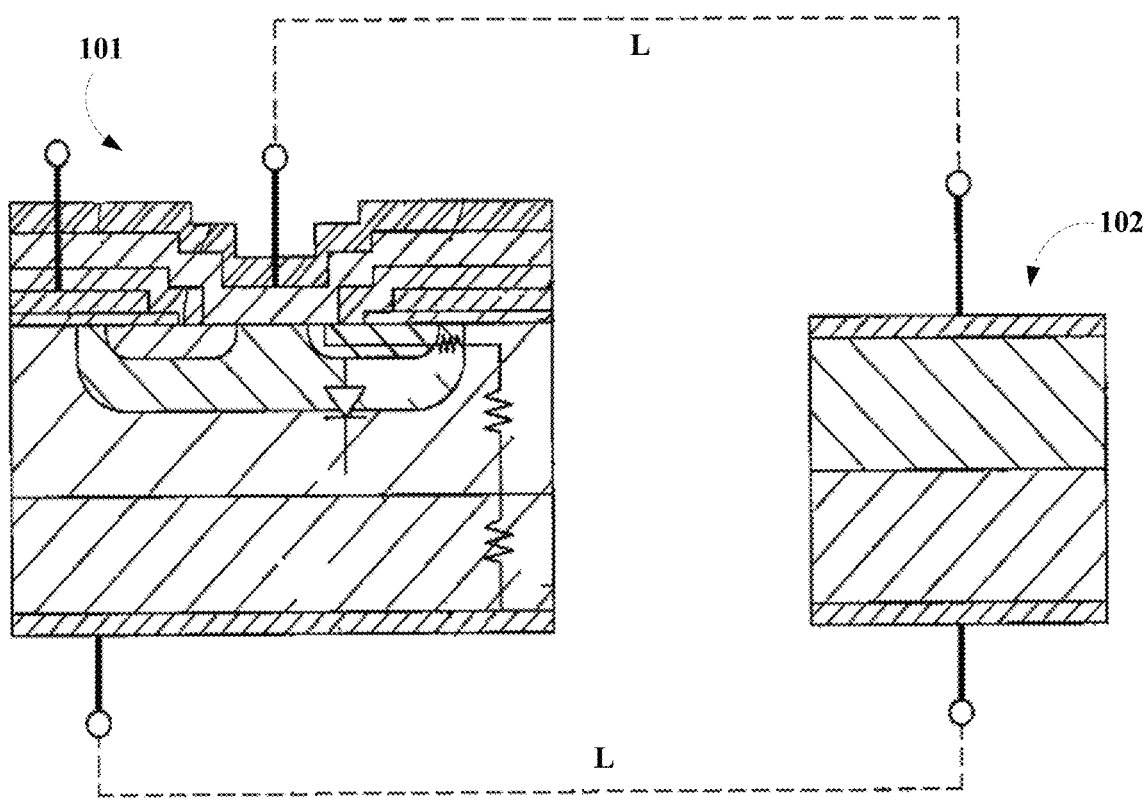
FIG. 1 is a diagram which shows a schematic illustration of the unipolar compound semiconductor element 101 and the bypass semiconductor element 102 in the prior art.
Figure 2:
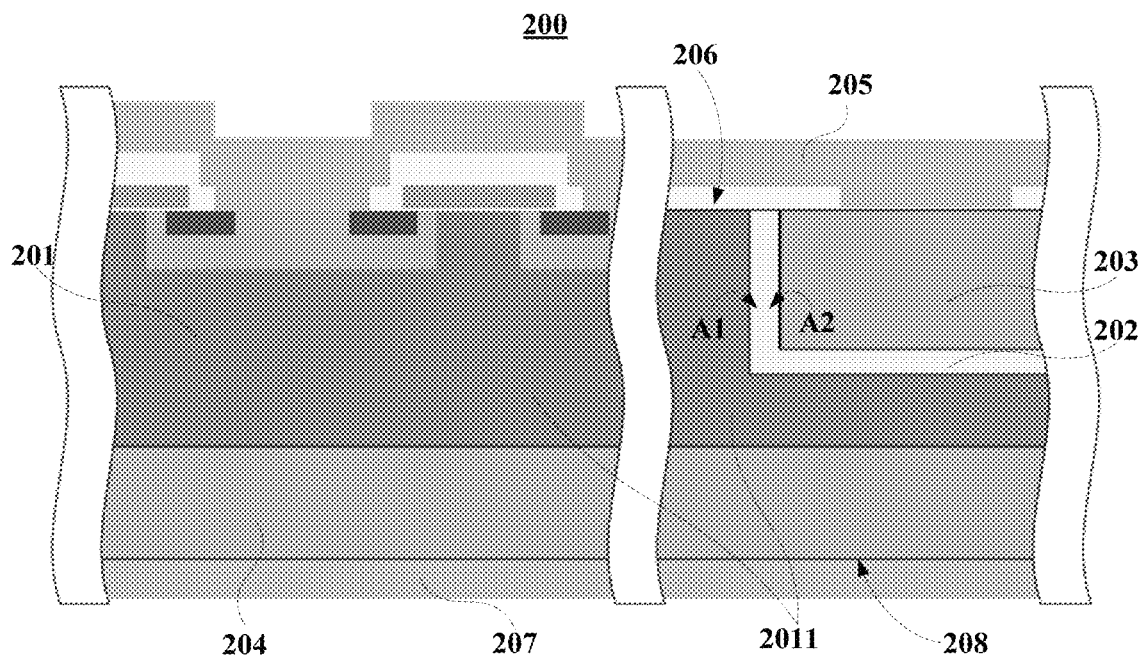
FIG. 2 is a diagram which shows a schematic illustration of a semiconductor device 200 in accordance with an embodiment of the present disclosure.

FIG. 2 is a diagram which shows a schematic illustration of a semiconductor device 200 in accordance with an embodiment of the present disclosure. As shown in FIG. 2, the semiconductor device 200 includes: a unipolar component 201 at least including an epitaxial layer 2011; a transition layer 202 connected to the epitaxial layer 2011; and a bypass component 203 connected to the transition layer 202.

As shown in FIG. 2, the unipolar component 201 and the bypass component 203 are connected in parallel and the transition layer 202 is configured between the unipolar component 201 and the bypass component 203.

In an embodiment, the unipolar component 201 may be a MOSFET (Metal Oxide Semiconductor Field Effect Transistor) element, the bypass component 203 may be an SBD (Schottky Barrier Diode) element; and it is not limited thereto.

As shown in FIG. 2, the semiconductor device 200 may further include a substrate 204 on which the epitaxial layer 2011 is configured.

As shown in FIG. 2, the unipolar component 201 and the bypass component 203 are integrated as one device. The bypass component 203 may be formed on a part of the unipolar component 201, and the two components are tightly connected (or contacted) via the transition layer 202.

For example, the bypass component 203 may be formed on the part of the unipolar component 201 via the transition layer 202 by such as epitaxially growing. For another example, the unipolar component 201 and the bypass component 203 may be formed separately and be brought into close contact with each other via the transition layer 202.

Therefore, the unipolar component and the bypass component are assembled via the transition layer in a semiconductor device, the assembly area can be decreased. Moreover, the heat generated in the bypass component (such as silicon type element) can be conducted to the unipolar component (such as silicon carbide element), such that the heat generation can be reduced.

Furthermore, heat generated in an operation and stress from external environment can be alleviated by the transition layer. Moreover, peeling and crack can be suppressed between the integrated two components.

It should be appreciated that the epitaxial layer may include a drift layer and/or an active layer, and so on; but it is not limited thereto. For example, the epitaxial layer may include N− type drift layer and/or N+ type drift layer; some related art may be used for reference.

In an embodiment, the bypass component may be a vertical type element. For example, the bypass component is a vertical type SBD and the unipolar component is a MOSFET.

As shown in FIG. 2, the semiconductor device 200 may further includes: a first electrode (or it may be referred to as surface electrode) 205 configured on a first side (surface) 206 of the unipolar component 201 and the bypass component 203; and a second electrode (or it may be referred to as backside electrode) 207 configured on a second side (backside) 208 of the unipolar component 201 and the bypass component 203.

In this embodiment, a source of the unipolar component 201 is connected to an anode of the bypass component 203 via the first electrode 205, for example, the first electrode 205 is shared by the unipolar component 201 and the bypass component 203. Furthermore, a drain of the unipolar component 201 is connected to a cathode of the bypass component 203 via the second electrode 207, for example, the second electrode 207 is shared by the unipolar component 201 and the bypass component 203.

In an embodiment, the bypass component may be a horizontal type element. For example, the bypass component is a horizontal type SBD and the unipolar component is a MOSFET.

Figure 3:
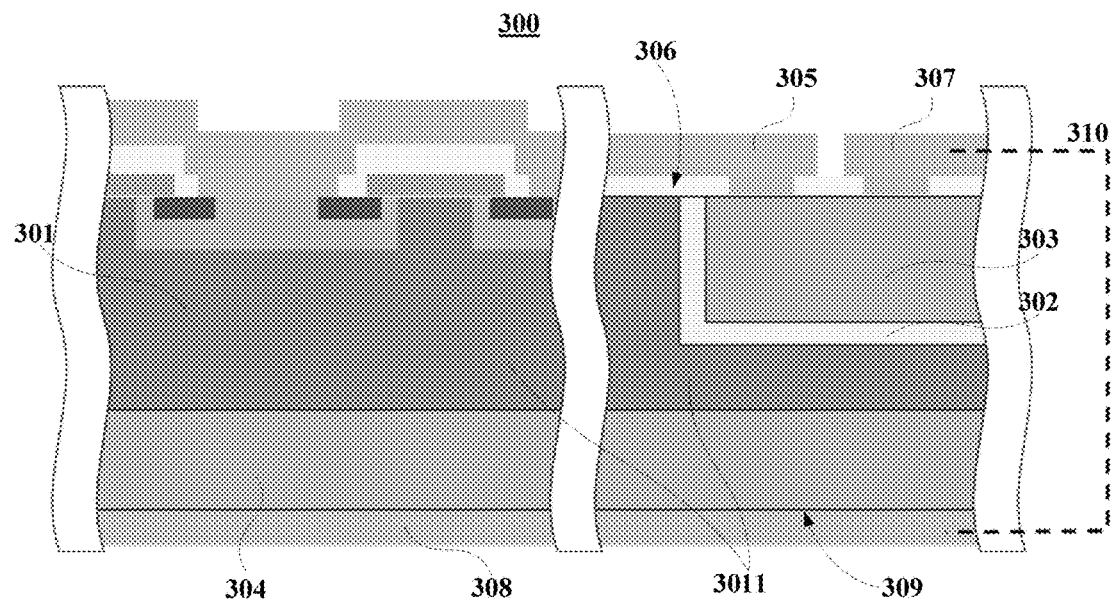
FIG. 3 is a diagram which shows a schematic illustration of a semiconductor device 300 in accordance with an embodiment of the present disclosure.

FIG. 3 is a diagram which shows a schematic illustration of a semiconductor device 300 in accordance with an embodiment of the present disclosure. As shown in FIG. 3, the semiconductor device 300 includes: a unipolar component 301 at least including an epitaxial layer 3011; a transition layer 302 connected to the epitaxial layer 3011; and a bypass component 303 connected to the transition layer 302.

As shown in FIG. 3, the unipolar component 301 and the bypass component 303 are connected in parallel and the transition layer 302 is configured between the unipolar component 301 and the bypass component 303.

As shown in FIG. 3, the semiconductor device 300 may further include a substrate 304 on which the epitaxial layer 3011 is configured.

As shown in FIG. 3, the semiconductor device 300 may further includes: a first electrode (or it may be referred to as a first surface electrode) 305 configured on a first side (surface) 306 of the unipolar component 301 and the bypass component 303; a second electrode (or it may be referred to as a second surface electrode) 307 configured on a first side 306 of the bypass component 303; and a third electrode (or it may be referred to as backside electrode) 308 configured on a second side (backside) 309 of the unipolar component 301 and the bypass component 303.

In this embodiment, a source of the unipolar component 301 is connected to an anode of the bypass component 303 via the first electrode 305, for example, the first electrode 305 is shared by the unipolar component 301 and the bypass component 303. Furthermore, a drain of the unipolar component 301 is connected to a cathode of the bypass component 303 via the second electrode 307 and the third electrode 308, for example, the third electrode 308 is shared by the unipolar component 301 and the bypass component 303.

As shown in FIG. 3, a line 310 is used between the second electrode 307 and the third electrode 308. However, it is not limited thereto, for example, the second electrode 307 and the third electrode 308 may be connected via a conductive pattern.

In an embodiment, at least one bypass component may be configured around at least one lateral side of the unipolar component. For example, as shown in FIG. 2 or 3, one bypass component 203 or 303 may be configured on one lateral side of the unipolar component 201 or 301. For another example, two or more bypass components may be configured on lateral sides of the unipolar component.

Figure 4:
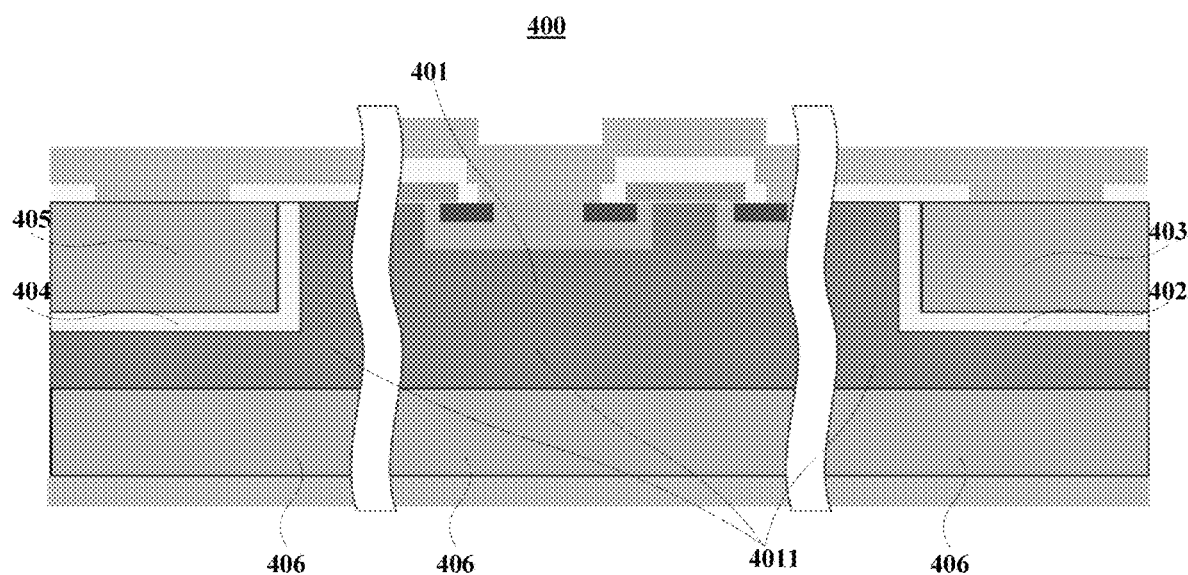
FIG. 4 is a diagram which shows a schematic illustration of a semiconductor device 400 in accordance with an embodiment of the present disclosure.

FIG. 4 is a diagram which shows a schematic illustration of a semiconductor device 400 in accordance with an embodiment of the present disclosure. As shown in FIG. 4, the semiconductor device 400 includes: a unipolar component 401 at least including an epitaxial layer 4011; a transition layer 402 connected to the epitaxial layer 4011; and a bypass component 403 connected to the transition layer 402.

As shown in FIG. 4, the semiconductor device 400 further includes: a transition layer 404 connected to the epitaxial layer 4011; and a bypass component 405 connected to the transition layer 404.

As shown in FIG. 4, the unipolar component 401 and the bypass component 403 are connected in parallel and the transition layer 402 is configured between the unipolar component 401 and the bypass component 403. Furthermore, the unipolar component 401 and the bypass component 405 are connected in parallel and the transition layer 404 is configured between the unipolar component 401 and the bypass component 405.

As shown in FIG. 4, the semiconductor device 400 may further include a substrate 406 on which the epitaxial layer 4011 is configured. For example, the bypass component 403 and the bypass component 405 are vertical type SBDs.

It should be appreciated that some components or elements are illustrated as examples in FIGS. 2-4. However, it is not limited thereto, for example, connections or positions of the components or elements may be adjusted, and/or, some components or elements may be omitted. Moreover, some components or elements not shown in FIGS. 2-4 may be added, while components or elements shown in FIGS. 2-4 but not explained can be referred in the relevant art.

Next, the transition layer is further illustrated in some examples.

In an embodiment, the bypass component may include silicon (Si) material, that is to say, the bypass component may be referred to as a silicon type element; and the transition layer may include silicon carbide (SiC) material, that is to say, the transition layer may be referred to as a silicon carbide type element.

In this embodiment, a concentration of carbide in the transition layer on the side of the unipolar component can be configured to be higher than the concentration of carbide in the transition layer on the side of the bypass component. Therefore, peeling and crack can be further suppressed between the integrated two components.

For example, as shown in FIG. 2, it assumed that the unipolar component 201 is a SiC-MOSFET and the bypass component 203 is a Si type element, the concentration of carbide in A1 of the transition layer 202 is higher than the concentration of carbide in A2 of the transition layer 202.

In an embodiment, the bypass component may gallium nitride (GaN) material, that is to say, the bypass component may be referred to as a GaN type element; and the transition layer may include indium aluminum gallium nitride (InAlGaN) material, that is to say, the transition layer may be referred to as an InAlGaN type element.

In this embodiment, a concentration of gallium in the transition layer on the side of the unipolar component can be configured to be lower than the concentration of gallium in the transition layer on the side of the bypass component. Therefore, peeling and crack can be further suppressed between the integrated two components.

For example, as shown in FIG. 2, it assumed that the unipolar component 201 is a SiC-MOSFET and the bypass component 203 is a GaN type element, the concentration of Ga in A1 of the transition layer 202 is lower than the concentration of Ga in A2 of the transition layer 202.

In an embodiment, the transition layer may include a multi-layer structure. For example, the transition layer may have a crystal structure of 3C—SiC(111); Si(111) may be the main surface of the bypass component. Therefore, the transition layer can be stacked without stress or with less stress, peeling and crack can be further suppressed between the integrated two components.

It is to be understood that, the above examples or embodiments are discussed for illustration, rather than limitation. Those skilled in the art would appreciate that there may be many other embodiments or examples within the scope of the present disclosure.

As can be seen from the above embodiments, a unipolar component and a bypass component are connected in parallel and a transition layer is configured between the unipolar component and the bypass component. Therefore, the unipolar component and the bypass component are assembled via the transition layer in a semiconductor device, the assembly area can be decreased while the heat generation can be reduced.

A Second Aspect of Embodiments

A method for forming a semiconductor device is provided in the embodiments. The semiconductor device is illustrated in the first aspect of embodiments, and the same contents as those in the first aspect of embodiments are omitted.

Figure 5:
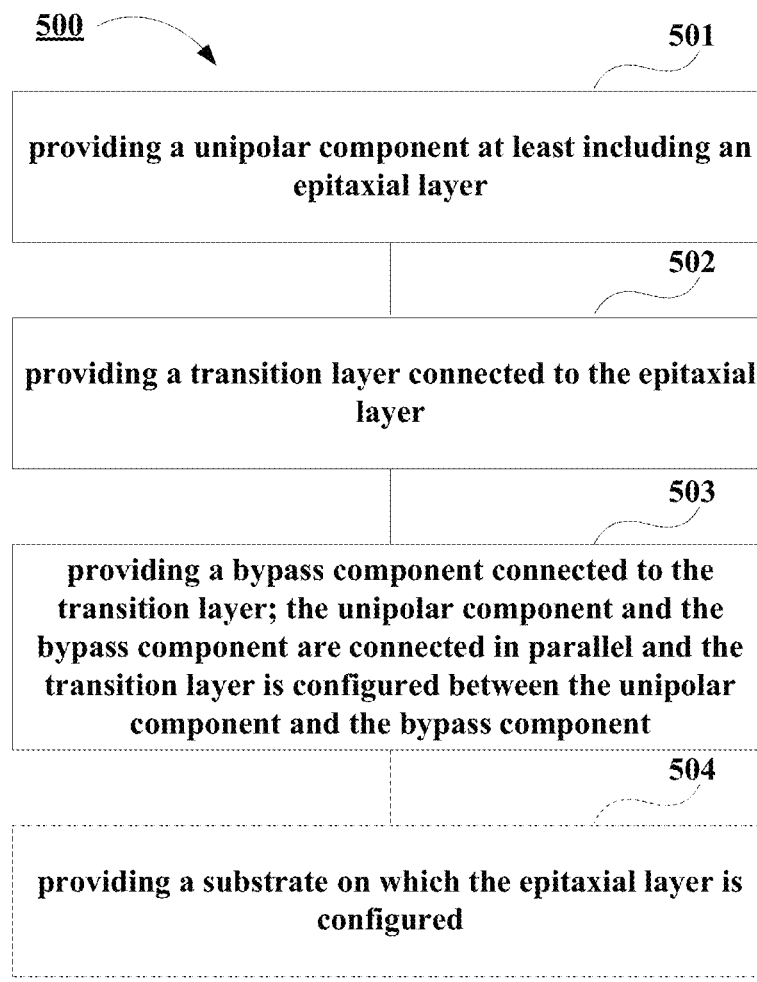
FIG. 5 is a diagram which shows a method for forming a semiconductor device in accordance with an embodiment of the present disclosure.

FIG. 5 is a diagram which shows a method for forming a semiconductor device in accordance with an embodiment of the present disclosure. As shown in FIG. 5, the method 500 includes:

Block 501, providing a unipolar component at least including an epitaxial layer;

Block 502, providing a transition layer connected to the epitaxial layer; and

Block 503, providing a bypass component connected to the transition layer; the unipolar component and the bypass component are connected in parallel and the transition layer is configured between the unipolar component and the bypass component.

As shown in FIG. 5, the method may further include:

Block 504, providing a substrate on which the epitaxial layer is configured.

It should be appreciated that FIG. 5 is only an example of the disclosure, but it is not limited thereto. For example, the order of operations at blocks or steps may be adjusted, and/or, some blocks or steps may be omitted. Moreover, some blocks or steps not shown in FIG. 5 may be added.

In an embodiment, the bypass component is a vertical type element; and the method may further include: providing a first electrode configured on a first side of the unipolar component and the bypass component; and providing a second electrode configured on a second side of the unipolar component and the bypass component;

In this embodiment, a source of the unipolar component is connected to an anode of the bypass component via the first electrode, a drain of the unipolar component is connected to a cathode of the bypass component via the second electrode.

In an embodiment, the bypass component is a horizontal type element; and the method may further include: providing a first electrode configured on a first side of the unipolar component and the bypass component; providing a second electrode configured on a first side of the bypass component; and providing a third electrode configured on a second side of the unipolar component and the bypass component;

In this embodiment, a source of the unipolar component is connected to an anode of the bypass component via the first electrode, a drain of the unipolar component is connected to a cathode of the bypass component via the second electrode and the third electrode.

In an embodiment, at least one bypass component is configured around at least one lateral side of the unipolar component.

In an embodiment, the bypass component includes silicon (Si) material; and the transition layer includes silicon carbide (SiC) material; a concentration of carbide in the transition layer on the side of the unipolar component is higher than the concentration of carbide in the transition layer on the side of the bypass component.

In an embodiment, the bypass component includes gallium nitride (GaN) material; and the transition layer includes indium aluminum gallium nitride (InAlGaN) material; a concentration of gallium in the transition layer on the side of the unipolar component is lower than the concentration of gallium in the transition layer on the side of the bypass component.

In an embodiment, the transition layer includes a multi-layer structure.

As can be seen from the above embodiments, a unipolar component and a bypass component are connected in parallel and a transition layer is configured between the unipolar component and the bypass component. Therefore, the unipolar component and the bypass component are assembled via the transition layer in a semiconductor device, the assembly area can be decreased while the heat generation can be reduced.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device.

While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous.

Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A semiconductor device, comprising:
   a unipolar component at least comprising an epitaxial layer;
   a transition layer connected to the epitaxial layer; and
   a bypass component connected to the transition layer;
   wherein the unipolar component and the bypass component are connected in parallel and the transition layer is configured between the unipolar component and the bypass component;
      wherein the bypass component comprises silicon material; and
      the transition layer comprises silicon carbide material;
   wherein a concentration of carbide in the transition layer on the side of the unipolar component is higher than the concentration of carbide in the transition layer on the side of the bypass component.

2. The semiconductor device according to claim 1, wherein the semiconductor device further comprises:
   a substrate on which the epitaxial layer is configured.

3. The semiconductor device according to claim 1, wherein the bypass component is a vertical type element.

4. The semiconductor device according to claim 3, wherein the semiconductor device further comprises:
   a first electrode configured on a first side of the unipolar component and the bypass component; and
   a second electrode configured on a second side of the unipolar component and the bypass component;
   wherein a source of the unipolar component is connected to an anode of the bypass component via the first electrode, a drain of the unipolar component is connected to a cathode of the bypass component via the second electrode.

5. The semiconductor device according to claim 1, wherein the bypass component is a horizontal type element.

6. The semiconductor device according to claim 5, wherein the semiconductor device further comprises:
   a first electrode configured on a first side of the unipolar component and the bypass component;
   a second electrode configured on the first side of the bypass component; and
   a third electrode configured on a second side of the unipolar component and the bypass component;
   wherein a source of the unipolar component is connected to an anode of the bypass component via the first electrode, a drain of the unipolar component is connected to a cathode of the bypass component via the second electrode and the third electrode.

7. The semiconductor device according to claim 1, wherein at least one bypass component is configured around at least one lateral side of the unipolar component.

8. The semiconductor device according to claim 1, wherein the transition layer comprises a multi-layer structure.

9. A semiconductor device comprising:
   a unipolar component at least comprising an epitaxial layer;
   a transition layer connected to the epitaxial layer; and
   a bypass component connected to the transition layer;
   wherein the unipolar component and the bypass component are connected in parallel and the transition layer is configured between the unipolar component and the bypass component;
   wherein the bypass component comprises gallium nitride (GaN) material; and the transition layer comprises indium aluminum gallium nitride (InAlGaN) material.

10. The semiconductor device according to claim 9, wherein a concentration of gallium in the transition layer on the side of the unipolar component is lower than the concentration of gallium in the transition layer on the side of the bypass component.

11. A method for forming a semiconductor device, comprising:
   providing a unipolar component at least comprising an epitaxial layer;
   providing a transition layer connected to the epitaxial layer; and
   providing a bypass component connected to the transition layer;
   wherein the unipolar component and the bypass component are connected in parallel and the transition layer is configured between the unipolar component and the bypass component;
   wherein the bypass component comprises silicon material; and
   the transition layer comprises silicon carbide material, a concentration of carbide in the transition layer on the side of the unipolar component is higher than the concentration of carbide in the transition layer on the side of the bypass component.

12. The method according to claim 11, wherein the method further comprises:
   providing a substrate on which the epitaxial layer is configured.

13. The method according to claim 11, wherein the bypass component is a vertical type element; and the method further comprises:
   providing a first electrode configured on a first side of the unipolar component and the bypass component; and
   providing a second electrode configured on a second side of the unipolar component and the bypass component;
   wherein a source of the unipolar component is connected to an anode of the bypass component via the first electrode, a drain of the unipolar component is connected to a cathode of the bypass component via the second electrode.

14. The method according to claim 11, wherein the bypass component is a horizontal type element; and the method further comprises:
   providing a first electrode configured on a first side of the unipolar component and the bypass component;
   providing a second electrode configured on a first side of the bypass component; and
   providing a third electrode configured on a second side of the unipolar component and the bypass component;
   wherein a source of the unipolar component is connected to an anode of the bypass component via the first electrode, a drain of the unipolar component is connected to a cathode of the bypass component via the second electrode and the third electrode.

15. The method according to claim 11, wherein at least one bypass component is configured around at least one lateral side of the unipolar component.

16. A method for forming a semiconductor device, comprising:
   providing a unipolar component at least comprising an epitaxial layer;
   providing a transition layer connected to the epitaxial layer; and
   providing a bypass component connected to the transition layer;
   wherein the unipolar component and the bypass component are connected in parallel and the transition layer is configured between the unipolar component and the bypass component;
   wherein the bypass component comprises gallium nitride (GaN) material; and the transition layer comprises indium aluminum gallium nitride (InAlGaN) material;
   a concentration of gallium in the transition layer on the side of the unipolar component is lower than the concentration of gallium in the transition layer on the side of the bypass component.

17. The method according to claim 11, wherein the transition layer comprises a multi-layer structure.

* * * * *